US009571056B2

(12) United States Patent
Scott et al.

(10) Patent No.: US 9,571,056 B2
(45) Date of Patent: Feb. 14, 2017

(54) POWER AMPLIFIER WITH SELF ALIGNED PEAKING STAGE

(71) Applicant: RF Micro Devices, Inc., Greensboro, NC (US)

(72) Inventors: Baker Scott, San Jose, CA (US); George Maxim, Saratoga, CA (US); Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/554,746

(22) Filed: Nov. 26, 2014

(65) Prior Publication Data

US 2015/0147986 A1    May 28, 2015

Related U.S. Application Data

(60) Provisional application No. 61/909,028, filed on Nov. 26, 2013.

(51) Int. Cl.
*H03G 3/30* (2006.01)
*H03F 1/52* (2006.01)
(Continued)

(52) U.S. Cl.
CPC .......... *H03G 3/3036* (2013.01); *H03F 1/0211* (2013.01); *H03F 1/0272* (2013.01); *H03F 1/223* (2013.01); *H03F 1/32* (2013.01); *H03F 1/523* (2013.01); *H03F 1/565* (2013.01); *H03F 3/19* (2013.01); *H03F 3/193* (2013.01); *H03F 3/45179* (2013.01); *H03F 3/45394* (2013.01); *H03F 3/68* (2013.01); *H04B 1/0475* (2013.01); *H03F 2200/324* (2013.01); *H03F 2200/387* (2013.01); *H03F 2200/451* (2013.01); *H03F 2200/471* (2013.01); *H03F 2201/3236* (2013.01); *H03G 3/3042* (2013.01); *H04B 2001/0408* (2013.01); *H04B 2001/0416* (2013.01); *H04B 2001/0425* (2013.01)

(58) Field of Classification Search
CPC combination set(s) only.
See application file for complete search history.

(56) References Cited

U.S. PATENT DOCUMENTS 6,275,106 B1 *   8/2001  Gomez ................. H03F 1/3247
                                                       330/149
2002/0017954 A1 * 2/2002  Hau ......................... H03F 1/32
                                                       330/149
(Continued)

*Primary Examiner* — Junpeng Chen
(74) *Attorney, Agent, or Firm* — Withrow & Terranova, P.L.L.C.

(57) ABSTRACT

RF PA circuitry includes an amplifier stage, gain compensation circuitry, and an adder. The amplifier stage is configured to receive and amplify an RF input signal to provide an RF output signal. The gain compensation circuitry is coupled in parallel with the amplifier stage and configured to receive the RF input signal and provide a gain compensation signal, wherein the gain compensation signal is configured to linearize at least a portion of the gain response of the amplifier stage or the RF PA circuitry in general. The adder is coupled between an output of the amplifier stage and the gain compensation stage and is configured to receive and add the RF output signal and the gain compensation signal to provide a linearized RF output signal.

21 Claims, 13 Drawing Sheets

(51) Int. Cl.
*H03F 1/02* (2006.01)
*H03F 3/19* (2006.01)
*H04B 1/04* (2006.01)
*H03F 1/32* (2006.01)
*H03F 3/68* (2006.01)
*H03F 1/22* (2006.01)
*H03F 1/56* (2006.01)
*H03F 3/45* (2006.01)
*H03F 3/193* (2006.01)

(56) References Cited

U.S. PATENT DOCUMENTS

| | | | |
|---|---|---|---|
| 2003/0001672 A1* | 1/2003 | Cavers | H03F 1/3247 330/149 |
| 2007/0262816 A1* | 11/2007 | Kashiwa | H03F 1/3205 330/136 |
| 2010/0219887 A1* | 9/2010 | Ichitsubo | G06F 1/181 330/124 R |
| 2012/0021704 A1* | 1/2012 | Chan | H03G 3/3042 455/95 |
| 2012/0081178 A1* | 4/2012 | Shi | H03F 1/3247 330/149 |

* cited by examiner

POWER AMPLIFIER WITH SELF ALIGNED PEAKING STAGE

RELATED APPLICATIONS

This application claims the benefit of U.S. provisional patent application Ser. No. 61/909,028, filed Nov. 26, 2013, the disclosure of which is incorporated herein by reference in its entirety.

FIELD OF THE DISCLOSURE

The present disclosure relates to radio frequency (RF) power amplifier (PA) circuitry, and specifically to RF PA circuitry with improved linearity.

BACKGROUND

Many radio frequency (RF) communications protocols rely upon amplitude modulation (AM) of an RF carrier signal to encode data therein. As RF communications protocols evolve, the required accuracy of this amplitude modulation continues to increase. For RF power amplifiers (PA), the linearity of the RF PA determines its ability to accurately replicate the amplitude of an RF input signal in proportion to the gain of the RF PA. Accordingly, the linearity of an RF PA is determined by the range of RF input signal power over which the gain response of the RF PA remains constant. Generally, the gain response of an RF PA is relatively flat over a range of RF input signal amplitudes, then tapers off at a certain point. One way to increase the range of input signals over which an RF PA produces a flat gain response is to increase a power supply voltage provided thereto. Known in the industry as increasing a voltage "headroom" of an RF PA, increasing the power supply voltage provided to an RF PA effectively extends the range of RF input signal power over which the gain response of the RF PA remains constant. Due to physical limitations of the RF PA, however, increasing the power supply voltage provided to the RF PA will only extend the linearity of the RF PA so far. Further, as the gain of the RF PA is increased, the range of RF input signal power over which the gain response of the RF PA remains constant decreases.

FIG. 1 shows a schematic of conventional RF PA circuitry 10. The conventional RF PA circuitry 10 includes a driver amplifier stage 12, an output amplifier stage 14, a power supply voltage VDD, and a choke inductor L_CH. FIGS. 2 and 3 show various operating conditions of the conventional RF PA circuitry 10. In operation, an RF input signal RF_IN is received at an input of the driver amplifier stage 12, where it is amplified and delivered to the output amplifier stage 14. The output amplifier stage 14 further amplifies the RF signal to provide an amplified RF output signal RF_OUT. The power supply voltage VDD provides power for amplification. As shown in FIG. 2, as the power supply voltage increases from V1 to V3, the range of input signal amplitudes over which the gain of the conventional RF PA circuitry 10 remains constant increases as discussed above. However, increasing the power supply voltage beyond a certain point, for example, V3, no longer has an effect on the linearity of the conventional RF PA circuitry 10 as discussed above. Further, as shown in FIG. 3, as the gain of the conventional RF PA circuitry 10 increases, the range of RF input signal power over which the gain of the conventional RF PA circuitry 10 remains constant decreases. Accordingly, in situations in which a high power input signal and/or high gain of the conventional RF PA circuitry 10 is required, the linearity of the conventional RF PA circuitry 10 will generally suffer.

In light of the above, there is a present need for RF PA circuitry with further improvements to the linearity thereof.

SUMMARY

The present disclosure relates to radio frequency (RF) power amplifier (PA) circuitry. In one embodiment RF PA circuitry includes an amplifier stage, gain compensation circuitry, and an adder. The amplifier stage is configured to receive and amplify an RF input signal to provide an RF output signal. The gain compensation circuitry is coupled in parallel with the amplifier stage and configured to receive the RF input signal and provide a gain compensation signal, wherein the gain compensation signal is configured to linearize at least a portion of the gain response of the amplifier stage. The adder is coupled between an output of the amplifier stage and the gain compensation stage and is configured to receive and add the RF output signal and the gain compensation signal to provide a linearized RF output signal. By including the gain compensation circuitry in parallel with the amplifier stage and adding the gain compensation signal to the RF output signal, the linearity of the RF PA circuitry can effectively be increased beyond the physical limits of the amplifier stage alone, thereby increasing the input power range with linear operation and thus the flexibility of the RF PA circuitry.

In one embodiment, RF PA circuitry includes a driver amplifier stage, driver stage gain compensation circuitry, a driver stage adder, an output amplifier stage, output stage gain compensation circuitry, and an output stage adder. The driver amplifier stage is configured to receive and amplify an RF input signal to provide an intermediate RF signal. The driver stage gain compensation circuitry is coupled in parallel with the driver amplifier stage and configured to receive the RF input signal and provide a driver stage gain compensation signal, wherein the driver stage gain compensation signal is configured to linearize at least a portion of the overall gain response of the RF PA circuitry. The driver stage adder is coupled between an output of the driver amplifier stage and the driver stage gain compensation circuitry and configured to receive and add the intermediate RF signal and the driver stage gain compensation signal to provide a linearized intermediate RF signal. The output amplifier stage is configured to receive and amplify the linearized intermediate RF signal to provide an RF output signal. The output stage gain compensation circuitry is coupled in parallel with the driver amplifier stage and configured to receive the linearized intermediate RF signal and provide an output stage gain compensation signal, wherein the output stage gain compensation signal is configured to linearize at least a portion of the gain response of the driver amplifier stage. Finally, the output stage adder is coupled between an output of the output amplifier stage and the output stage gain compensation circuitry and configured to receive and add the RF output signal and the output stage gain compensation signal to provide a linearized RF output signal. By including the driver stage gain compensation circuitry in parallel with the driver amplifier stage and adding the driver stage gain compensation signal to the intermediate RF signal, and further by optionally including the output stage gain compensation circuitry in parallel with the output amplifier stage and adding the output stage gain compensation signal to the RF output signal, the linearity of the RF PA circuitry can effectively be increased beyond the physical limits of the driver amplifier stage and the output amplifier stage, thereby increasing the input power range and thus the flexibility of the RF PA circuitry.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
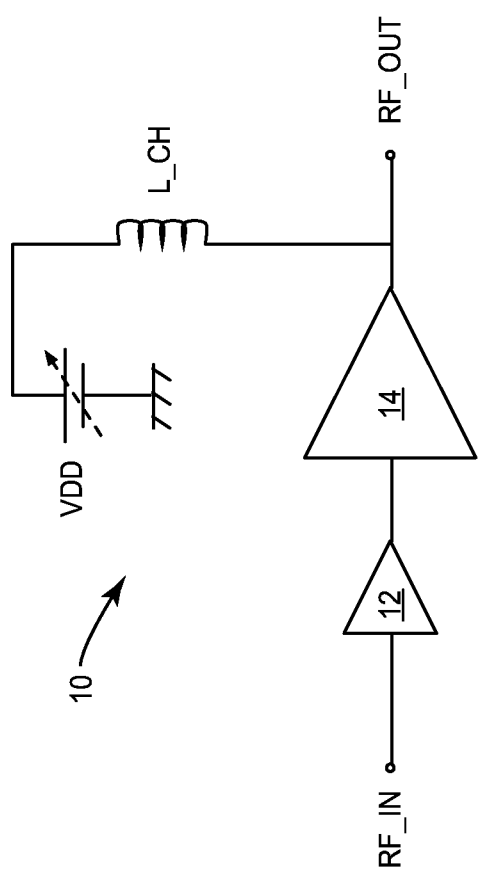
FIG. 1 is a schematic illustrating a conventional radio frequency (RF) power amplifier (PA) circuitry.
Figure 2:
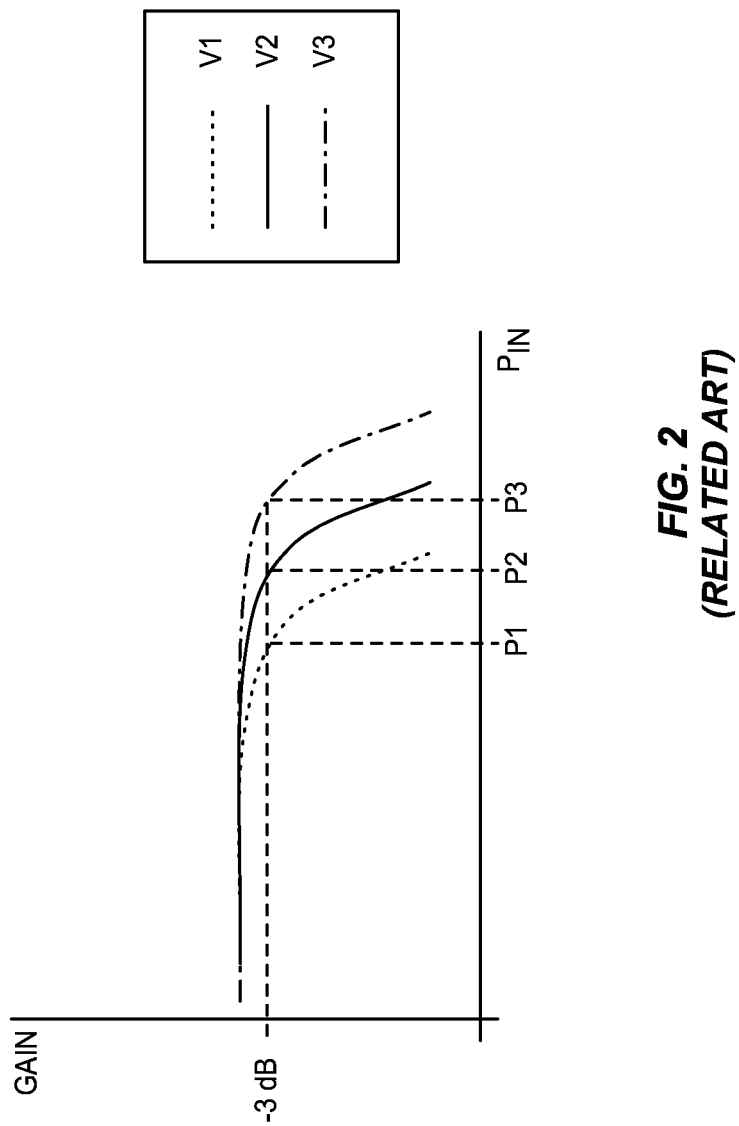
FIG. 2 is a graph illustrating the relationship of a supply voltage provided to RF PA circuitry and the gain of the RF PA.
Figure 3:
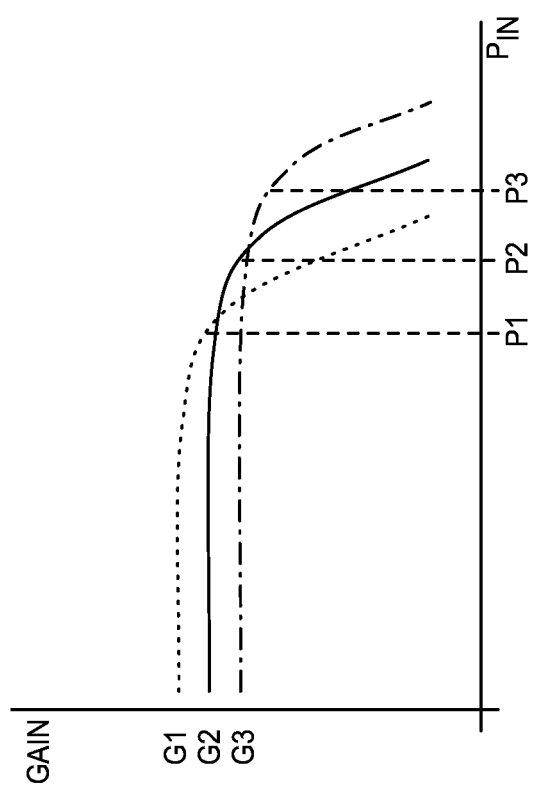
FIG. 3 is a graph illustrating the relationship of the gain of an RF PA and the output power range of the RF PA.
Figure 4:
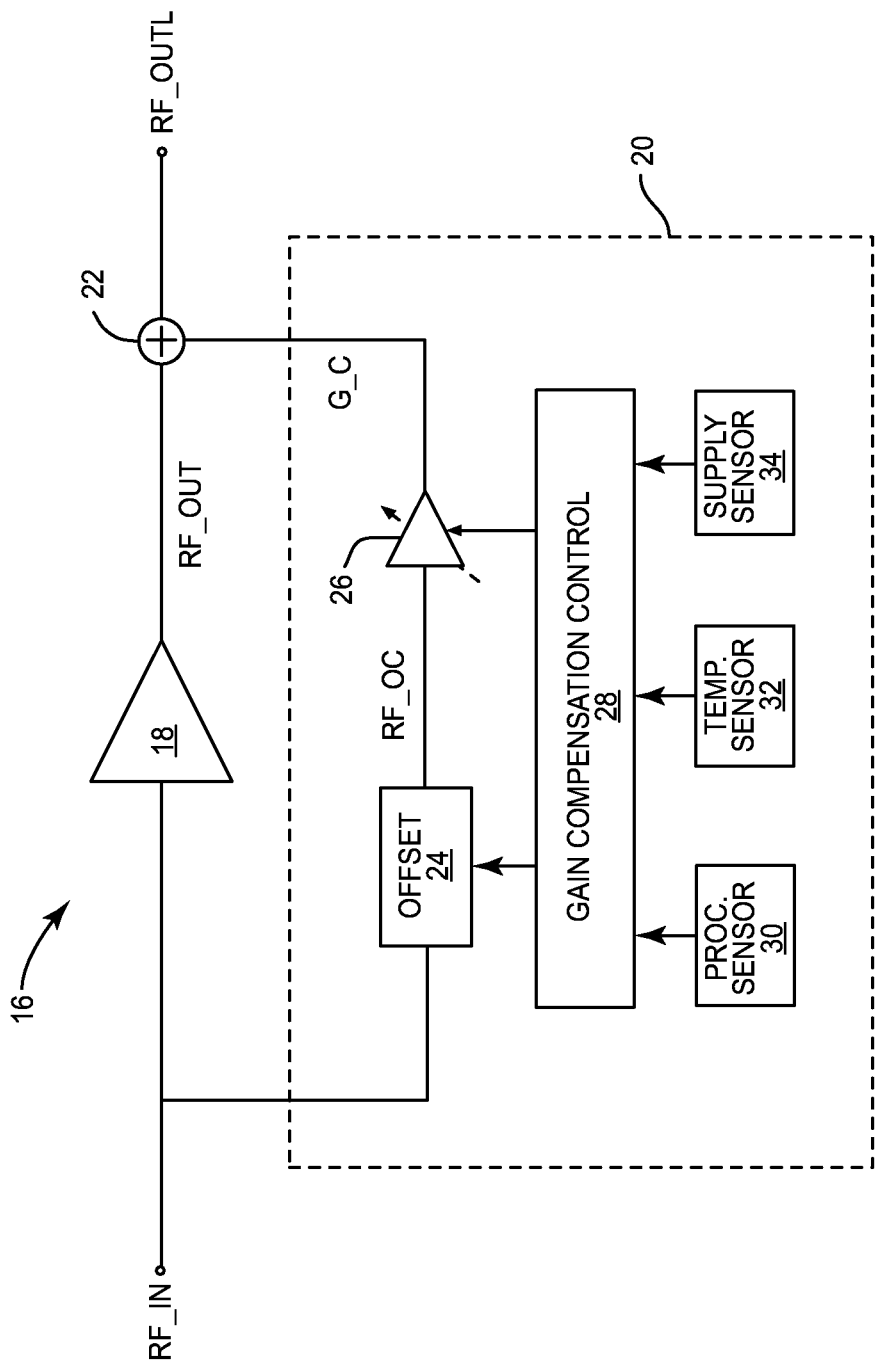
FIG. 4 is a schematic illustrating RF PA circuitry including gain compensation circuitry according to one embodiment of the present disclosure.

FIG. 4 shows radio frequency (RF) power amplifier (PA) circuitry 16 according to one embodiment of the present disclosure. The RF PA circuitry 16 includes an amplifier stage 18 and gain compensation circuitry 20. The amplifier stage 18 is configured to receive and amplify an RF input signal RF_IN to produce an RF output signal RF_OUT. Accordingly, the amplifier stage 18 may be any suitable amplifier circuitry, including but not limited to one or more metal-oxide-semiconductor field-effect transistors (MOSFETs), bipolar junction transistors (BJTs), high electron mobility transistors (HEMTs), or the like, the details of which are well known in the art. Further, the amplifier stage 18 may include any number of stages. As discussed above, in order to increase the linearity of the amplifier stage 18, a supply voltage VDD provided to the amplifier stage 18 may be increased, however, the gain of the amplifier stage 18, and thus power range of the RF input signal RF_IN over which the amplitude of the RF output signal is linearly proportional to the RF input signal RF_IN is limited by the physical properties of the amplifier stage. Additionally, increasing the supply voltage VDD results in a degraded efficiency of the amplifier stage 18, and thus ways to improve linearity that do not degrade efficiency are needed. As further discussed above, increasing the gain of the amplifier stage 18 may result in a decrease in the input power range of the RF input signal RF_IN over which the amplifier stage 18 can accurately reproduce the RF input signal RF_IN. Accordingly, the linearity of the RF output signal RF_OUT may suffer in cases in which a high power RF input signal RF_IN is provided or a large gain is required.

The gain compensation circuitry 20 is thus provided to linearize at least a portion of the gain response of the amplifier stage 18 or the RF PA circuitry 16 in general. In general, the gain compensation circuitry 20 provides a gain compensation signal G_C, which is added to the RF output signal RF_OUT via an adder 22. The gain compensation signal G_C counteracts an expansion or contraction of the gain response of the amplifier stage 18 over a range of input power of the RF input signal RF_IN, such that the linearity of the amplifier stage 18 is improved. The gain compensation circuitry 20 may include any number of components, however, the gain compensation circuitry 20 is shown including gain compensation offset control circuitry 24 and gain compensation amplitude control circuitry 26 for illustration purposes. The gain compensation offset control circuitry 24 receives the RF input signal RF_IN and changes a phase of the RF input signal RF_IN as necessary to produce an offset-controlled RF signal RF_OC, which is subsequently used to alter a threshold of device activation for the amplifier stage 18 (e.g., through a biasing signal provided thereto). The gain compensation amplitude control circuitry 26 receives the offset-controlled RF signal RF_OC and changes the amplitude of the offset-controlled RF signal RF_OC to produce the gain compensation signal G_C. Accordingly, the gain response of the gain compensation circuitry 20 may be fully adjusted.

In order to control the gain compensation offset control circuitry 24 and the gain compensation amplitude control circuitry 26, gain compensation control circuitry 28 is coupled to each one of the gain compensation offset control circuitry 24 and the gain compensation amplitude control circuitry 26. The gain compensation control circuitry 28 may further be coupled to any number of sensors including a process sensor 30, a temperature sensor 32, and a supply voltage sensor 34. The gain compensation control circuitry 28 may receive measurements from the process sensor 30, the temperature sensor 32, the supply voltage sensor 34, or any other sensor circuitry, and change the offset and/or amplitude of the gain compensation signal G_C accordingly such that a desired gain response is produced by the gain compensation circuitry 20. In general, the gain compensation control circuitry 28 receives one or more measurements that may be indicative of changes in the linearity of the amplifier stage 18 and changes one or more characteristics of the gain compensation signal G_C to compensate for such changes and therefore increase the overall linearity of the RF PA circuitry 16.

Figure 5B:
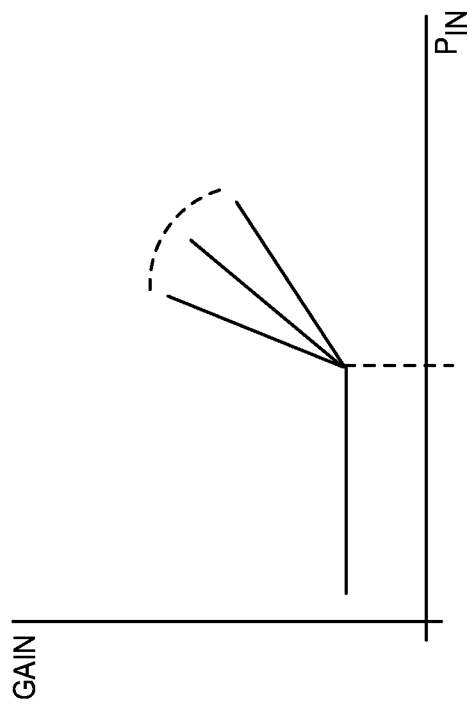
FIGS. 5A and 5B are graphs illustrating the adjustability of a gain compensation signal produced by the gain compensation circuitry shown in FIG. 4 according to one embodiment of the present disclosure.
Figure 5A:
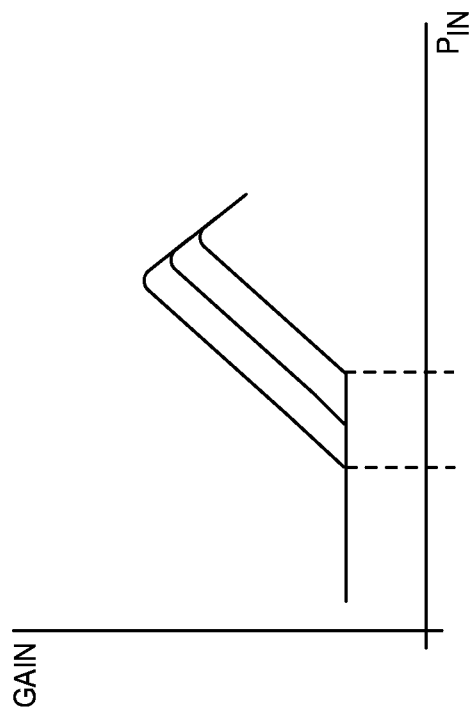

FIGS. 5A and 5B are graphs illustrating the adjustability of the response of the gain compensation circuitry 20 based on the requirements of the amplifier stage 18. FIG. 5A illustrates one or more adjustments to an offset of the response of the gain compensation circuitry 20, wherein the location of the response with respect to the input power range of the amplifier stage 18 is changed. The offset determines the power level at which the gain expansion (and/or contraction) starts, which needs to be aligned with the power level at which the amplifier stage 18 begins compressing (or expanding). FIG. 5B illustrates adjusting the slope of the response of the gain compensation circuitry 20, wherein the slope and amplitude of the response are changed. Notably, changes in the gain response of the amplifier stage 18 are often non-linear. Accordingly, the response of the gain compensation circuitry 20 may similarly need to be non-linear in order to properly compensate the amplifier stage 18 and improve the linearity thereof.

In general, the gain compensation control circuitry 28 receives one or more measurements indicative of a decrease in the linearity of the amplifier stage 18. Accordingly, the gain compensation control circuitry 28 changes one or more operating parameters of the gain compensation offset control circuitry 24 and the gain compensation amplitude control circuitry 26 such that an equal and opposite gain response to the region of non-linearity in the gain response of the amplifier stage 18 is produced and provided to the amplifier stage 18 via the gain compensation signal G_C. Accordingly, when the gain compensation signal G_C is added to the RF output signal RF_OUT, the non-linear portion of the gain response of the amplifier stage 18 is offset by the gain response of the gain compensation circuitry 20 to produce a combined gain response that is significantly linear over a desired range of input power.

Figure 6:
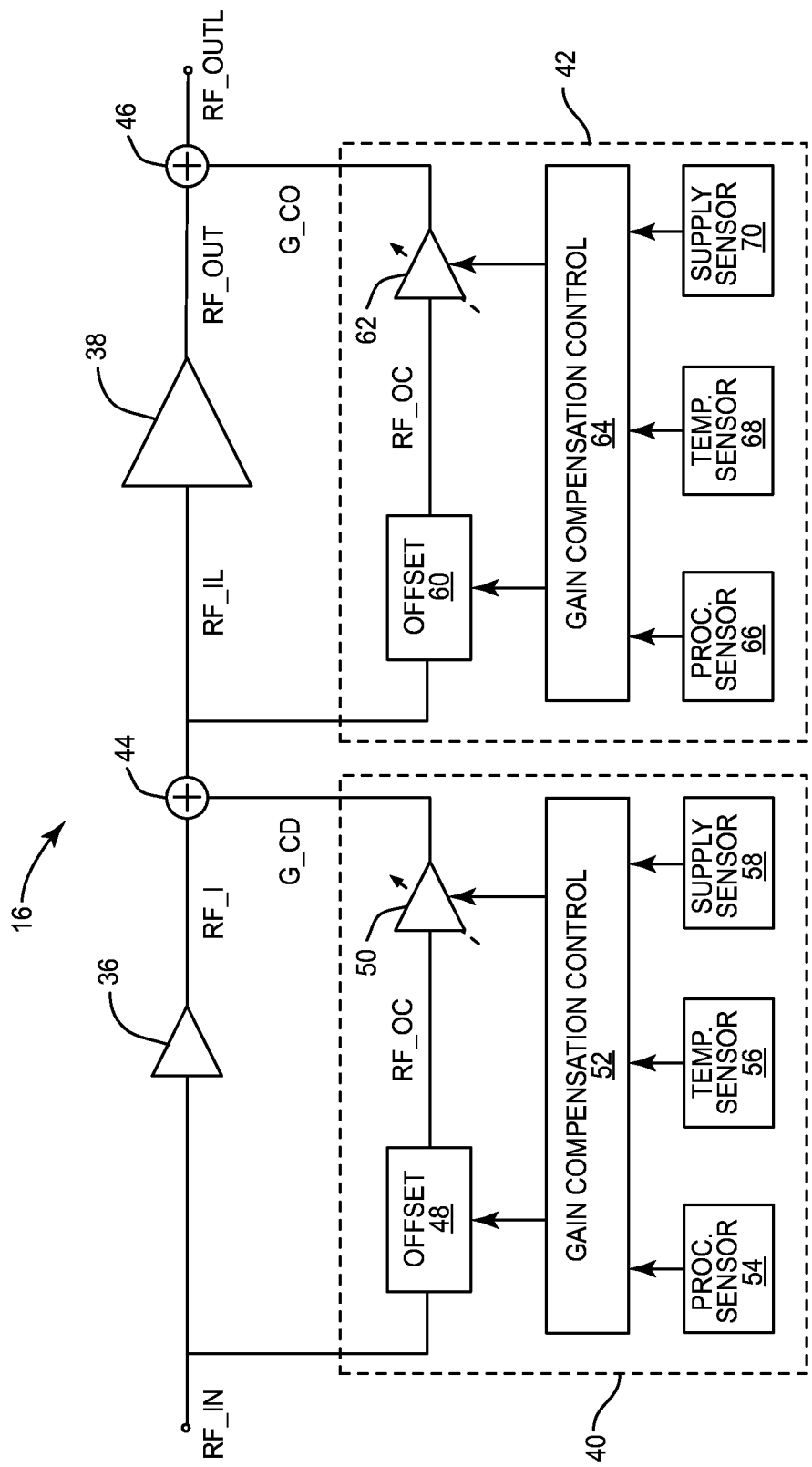
FIG. 6 is a schematic illustrating RF PA circuitry including gain compensation circuitry according to an additional embodiment of the present disclosure.

FIG. 6 shows the RF PA circuitry 16 according to an additional embodiment of the present disclosure. The RF PA circuitry 16 includes a driver amplifier stage 36, an output amplifier stage 38, driver stage gain compensation circuitry 40, and output stage gain compensation circuitry 42. As discussed above, the driver amplifier stage 36 and the output amplifier stage 38 may be any suitable amplifier circuitry including MOSFETs, BJTs, HEMTs, or the like, the details of which are well known in the art. As further discussed above, the linearity of the driver amplifier stage 36 and the output amplifier stage 38 are each limited by the physical properties of the respective amplifier stages. Accordingly, in order to increase the linearity of the driver amplifier stage 36 and the output amplifier stage 38 either separately or together such that the overall linearity of the RF PA circuitry 18 is increased, the driver stage gain compensation circuitry 40 and the output stage gain compensation circuitry 42 are respectively provided.

In operation, the driver amplifier stage 36 receives an RF input signal RF_IN, which may be delivered from any number of components in attached RF front end circuitry (not shown) or from a previous driver stage (not shown). The driver amplifier stage 36 amplifies the RF input signal RF_IN to produce an intermediate RF signal RF_I. To compensate for nonlinearities in the gain response of the driver amplifier stage 36, the driver stage gain compensation circuitry 40 also receives the RF input signal RF_IN and produces a driver stage gain compensation signal G_CD, which is added to the intermediate RF signal RF_I by a driver stage adder 44. The resulting linearized intermediate RF signal RF_IL is provided to the output amplifier stage 38 and the output stage gain compensation circuitry 42. The output amplifier stage 38 further amplifies the linearized intermediate RF signal RF_IL to produce an RF output signal RF_OUT. To compensate for nonlinearities in the gain response of the output amplifier stage 38, the output stage gain compensation circuitry 42 also receives the linearized intermediate RF signal RF_IL and produces an output stage gain compensation signal G_CO, which is added to the RF output signal RF_OUT by an output stage adder 46. The resulting linearized RF output signal RF_OUTL is then provided, for example, to an antenna (not shown) via some type of tuning circuitry (not shown).

The driver stage gain compensation circuitry 40 includes gain compensation offset control circuitry 48, gain compensation amplitude control circuitry 50, and gain compensation control circuitry 52. The gain compensation control circuitry 52 receives input from a number of sensors that may be related to the linearity of the driver amplifier stage 36. For example, the gain compensation control circuitry 52 may be coupled to one or more of a process sensor 54, a temperature sensor 56, and a supply voltage sensor 58. The gain compensation control circuitry 52 may relate one or more of the sensor measurements to the linearity of the driver amplifier stage 36 in order to detect nonlinearity in the gain response thereof. The gain compensation control circuitry 52 then controls the gain compensation offset control circuitry 48 and the gain compensation amplitude control circuitry 50 to produce the driver stage gain compensation signal G_CD with a gain response that is equal to but opposite that of the driver amplifier stage 36 during a nonlinear portion thereof. Accordingly, when the driver stage gain compensation signal G_CD is added to the intermediate RF signal RF_I, the result is the linearized intermediate RF signal RF_IL.

Similar to the driver stage gain compensation circuitry 40, the output stage gain compensation circuitry 42 includes gain compensation offset control circuitry 60, gain compensation amplitude control circuitry 62, and gain compensation control circuitry 64. The gain compensation control circuitry 64 receives input from a number of sensors that may be related to the linearity of the output amplifier stage 38. For example, the gain compensation control circuitry 64 may be coupled to one or more of a process sensor 66, a temperature sensor 68, and a supply voltage sensor 70. The gain compensation control circuitry 64 may relate one or more of the sensor measurements to the linearity of the output amplifier stage 38 in order to detect nonlinearity in the gain response thereof. The gain compensation control circuitry 64 then controls the gain compensation offset control circuitry 60 and the gain compensation amplitude control circuitry 62 to produce the output stage gain compensation signal G_CO with a gain response that is equal to but opposite that of the output amplifier stage 38 during a nonlinear portion thereof. Accordingly, when the output stage gain compensation signal G_CO is added to the RF output signal RF_OUT, the result is the linearized RF output signal RF_OUTL.

The gain compensation offset control circuitry in both the driver stage gain compensation circuitry 40 and the output stage gain compensation circuitry 42 may be any suitable circuitry for altering the phase of an RF signal and therefore an offset of the gain response of the gain compensation circuitry 20. The gain compensation amplitude control circuitry in both the driver stage gain compensation circuitry 40 and the output stage gain compensation circuitry 42 may be any suitable circuitry for altering the slope of an RF signal and therefore the magnitude of the gain response provided by the driver stage gain compensation circuitry 40 and the output stage gain compensation circuitry 42, respectively. Since the details of implementing circuitry for changing the phase and slope of an RF signal are well known in the art, they are omitted in the present disclosure. In one embodiment, the gain compensation amplitude control circuitry in both the driver stage gain compensation circuitry 40 and the output stage gain compensation circuitry 42 includes a variable gain amplifier.

Although the gain compensation control circuitry in each one of the driver stage gain compensation circuitry 40 and the output stage gain compensation circuitry 42 are shown coupled to a process sensor, temperature sensor, and supply voltage sensor, any number of additional sensors may be coupled to the gain compensation control circuitry and used to detect nonlinearity of a given amplifier stage. Further, although only a single driver amplifier stage 36 is shown, any number of driver amplifier stages including individual or shared gain compensation circuitry may be used without departing from the principles of the present disclosure. The driver stage gain compensation circuitry 40 and the output stage gain compensation circuitry 42 may be used to compensate additional stages such that only one of the driver stage gain compensation circuitry 40 or the output stage gain compensation circuitry 42 provides gain compensation to all of the stages in the RF PA circuitry 16. That is, the driver stage gain compensation circuitry 40 and the output stage gain compensation circuitry 42 may be used independently from another without departing from the principles of the present disclosure.

Figure 7:
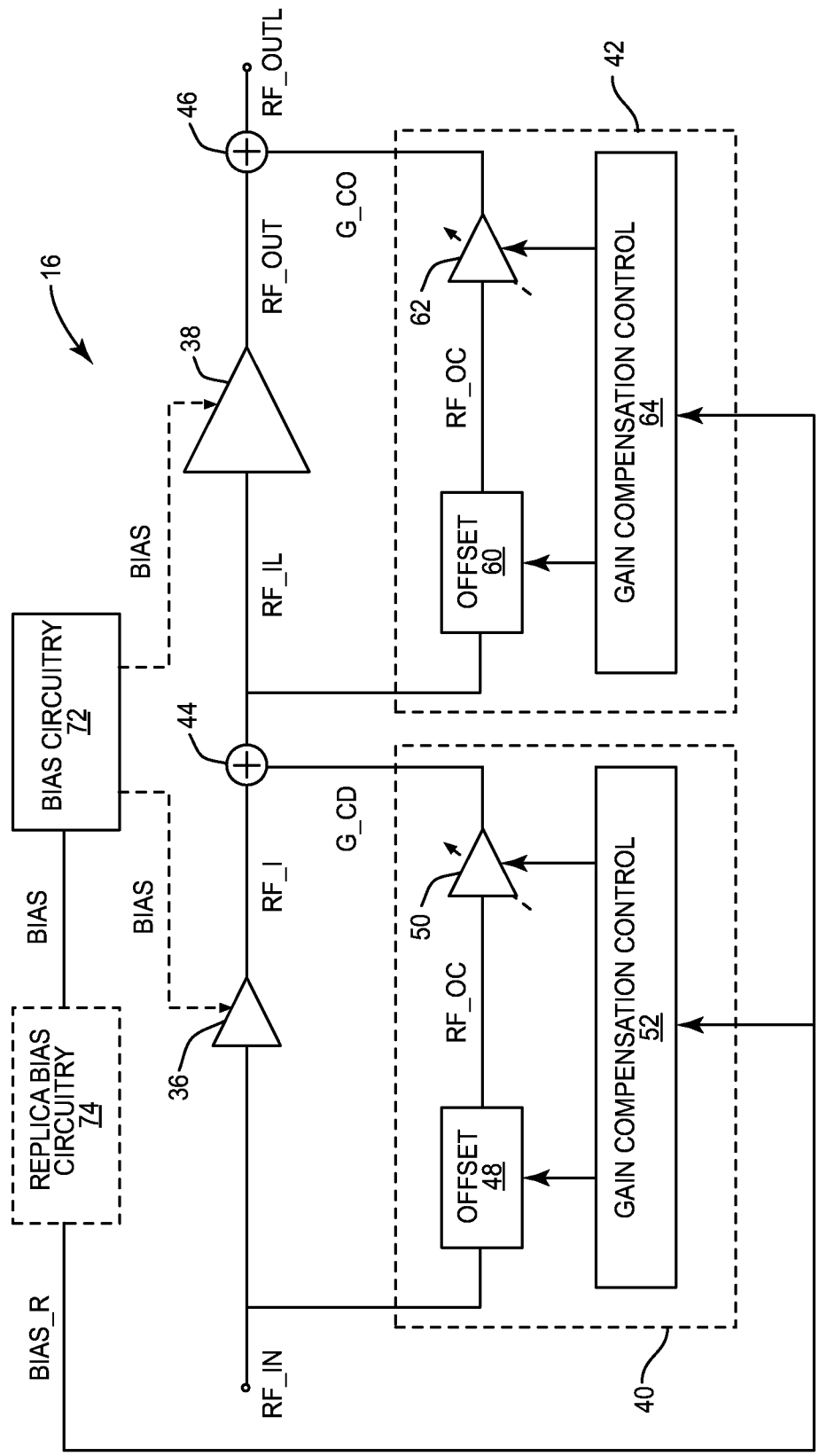
FIG. 7 is a schematic illustrating RF PA circuitry including gain compensation circuitry according to an additional embodiment of the present disclosure.

FIG. 7 shows the RF PA circuitry 16 according to an additional embodiment of the present disclosure. The RF PA circuitry 16 shown in FIG. 7 is substantially similar to that shown in FIG. 6, but further includes bias circuitry 72, which provides a bias signal BIAS to each one of the driver amplifier stage 36 and the output amplifier stage 38. Further, the RF PA circuitry 16 includes replica bias circuitry 74, which replicates the bias signal BIAS provided to each one of the driver amplifier stage 36 and the output amplifier stage 38, delivering a replica bias signal BIAS_R to the gain compensation control circuitry in each one of the driver stage gain compensation circuitry 40 and the output stage gain compensation circuitry 42. Because the bias signal BIAS and thus the replica bias signal BIAS_R may be indicative of the linearity of the driver amplifier stage 36 and the output amplifier stage 38, the gain compensation control circuitry in each one of the driver stage gain compensation circuitry 40 and the output stage gain compensation circuitry 42 may use the replica bias signal BIAS_R to control the properties of the driver stage gain compensation signal G_CD and the output stage gain compensation signal G_CO, respectively, in order to improve the linearity of the driver amplifier stage 36 and the output amplifier stage 38 as discussed above.

The bias circuitry 72 may be designed according to principles well known in the art, and thus the details of the circuitry are not included herein. Similarly, the replica bias circuitry 74 may also be designed according to well known principles and the details are therefore omitted herein.

Figure 8:
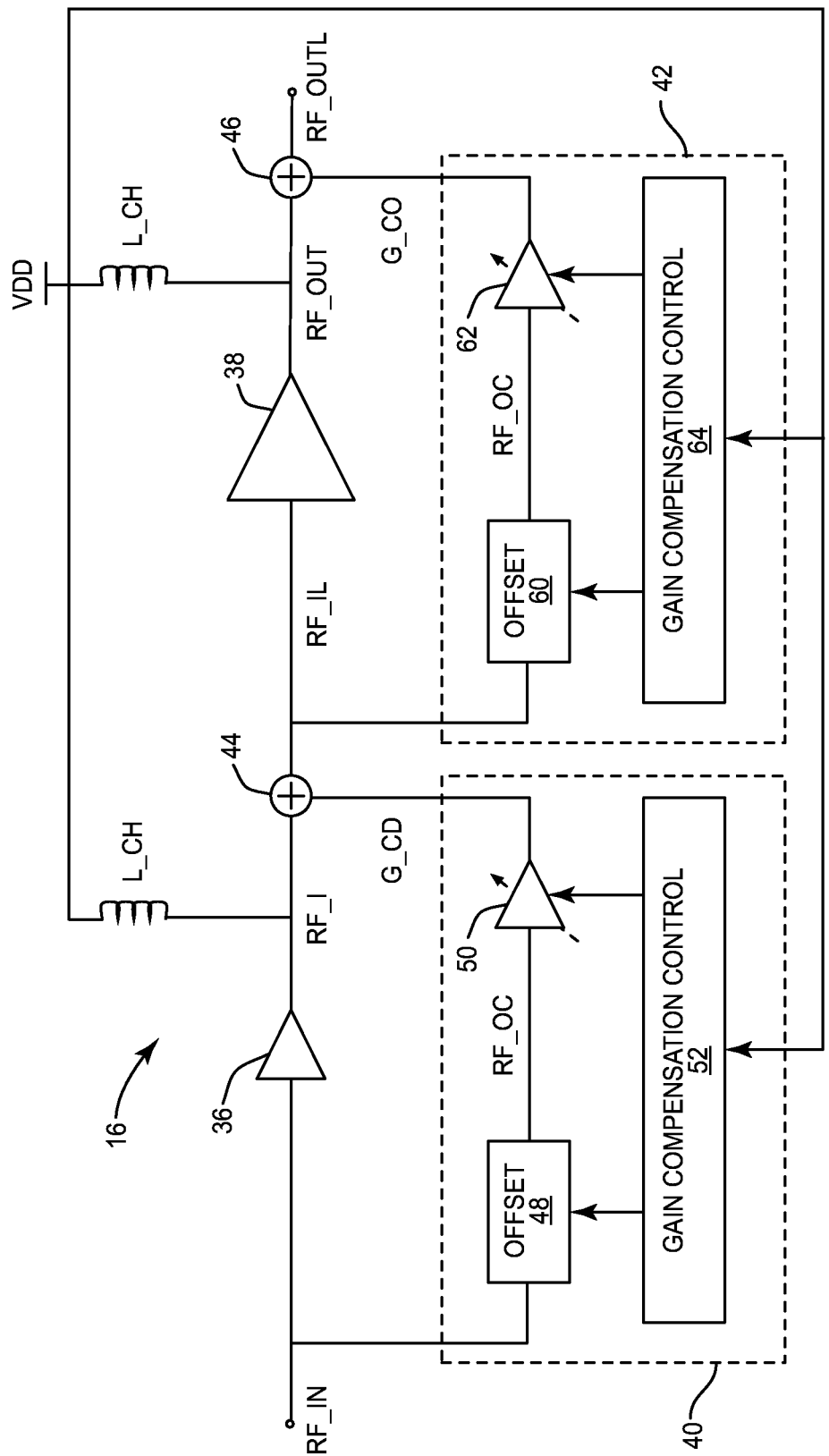
FIG. 8 is a schematic illustrating RF PA circuitry including gain compensation circuitry according to an additional embodiment of the present disclosure.

FIG. 8 shows the RF PA circuitry 16 according to an additional embodiment of the present disclosure. The RF PA circuitry 16 shown in FIG. 8 is substantially similar to that shown in FIG. 6, but further shows a supply voltage VDD coupled to each one of the driver amplifier stage 36 and the output amplifier stage 38 via a respective choke inductor L_CH. Further, the supply voltage VDD is coupled to the gain compensation control circuitry in each one of the driver stage gain compensation circuitry 40 and the output stage gain compensation circuitry 42. Because the supply voltage VDD may be indicative of the linearity of the driver amplifier stage 36 and the output amplifier stage 38, the gain compensation control circuitry in each one of the driver stage gain compensation circuitry 40 and the output stage gain compensation circuitry 42 may use the supply voltage VDD to control the properties of the driver stage gain compensation signal G_CD and the output stage gain compensation signal G_CO, respectively, in order to improve the linearity of the driver amplifier stage 36 and the output amplifier stage 38 as discussed above.

Figure 9:
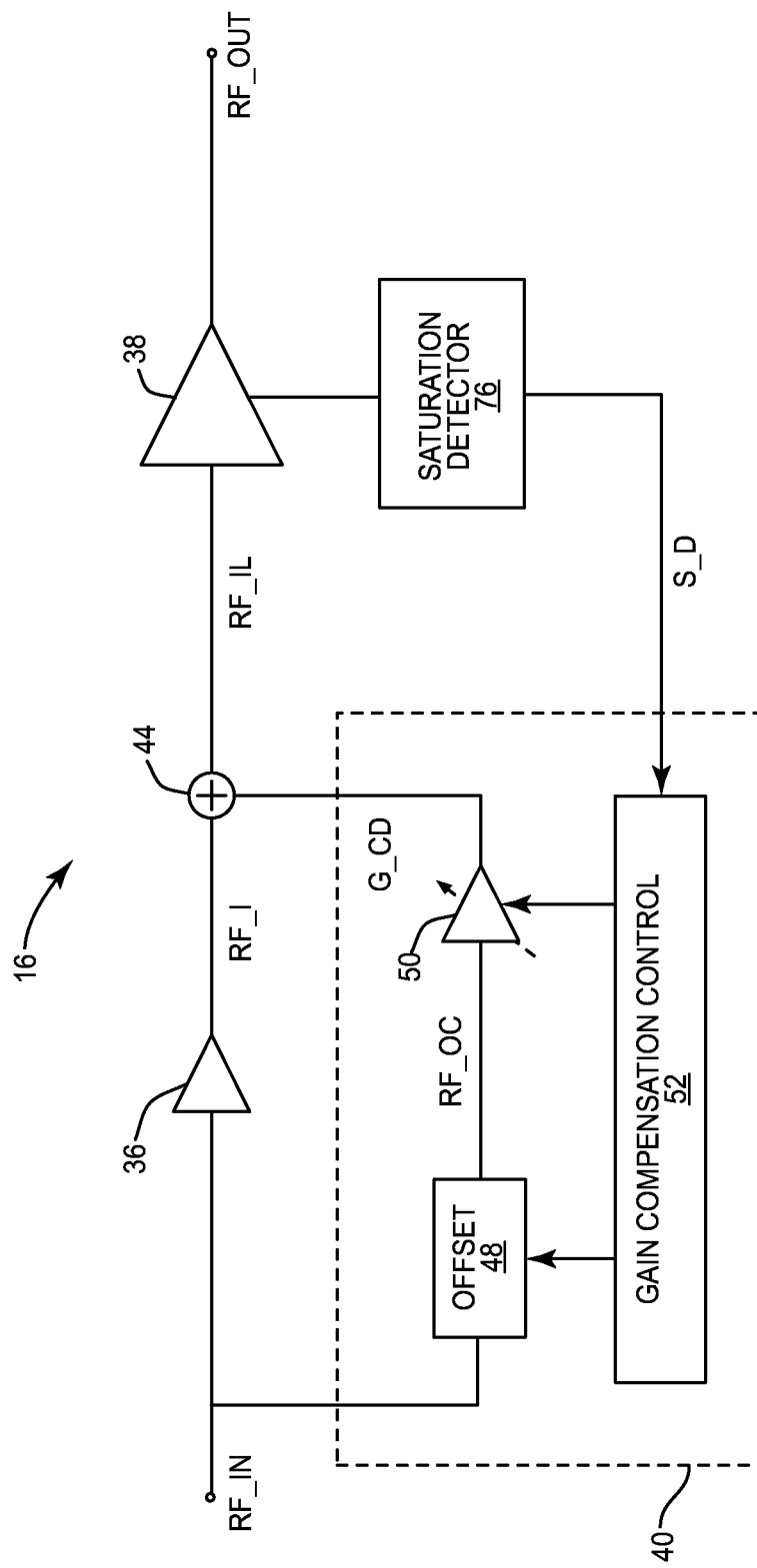
FIG. 9 is a schematic illustrating RF PA circuitry including gain compensation circuitry according to an additional embodiment of the present disclosure.

FIG. 9 shows the RF PA circuitry 16 according to yet another embodiment of the present disclosure. The RF PA circuitry 16 shown in FIG. 9 is substantially similar to that shown in FIG. 6, but replaces the various sensors shown in FIG. 6 with saturation detector circuitry 76, which is coupled to the output amplifier stage 38. The saturation detector circuitry 76 detects when the output amplifier stage 38 is at or near saturation, providing a saturation detection signal S_D to the gain compensation control circuitry 52 in the driver stage gain compensation circuitry 40. While the output stage gain compensation circuitry 42 is omitted in FIG. 9, it may be used in addition to the concepts described in FIG. 9 as well. Since saturation of the output amplifier stage 38 may be indicative of the point at which the linearity of the output amplifier stage 38 begins to suffer, the gain compensation signal G_C may be provided based on the saturation detection signal S_D to prevent saturation and thus increase the linearity of the RF PA circuitry 16. In general, the driver stage gain compensation circuitry 40 shown in FIG. 9 compensates for nonlinearity in the output amplifier stage 38.

Figure 10A:
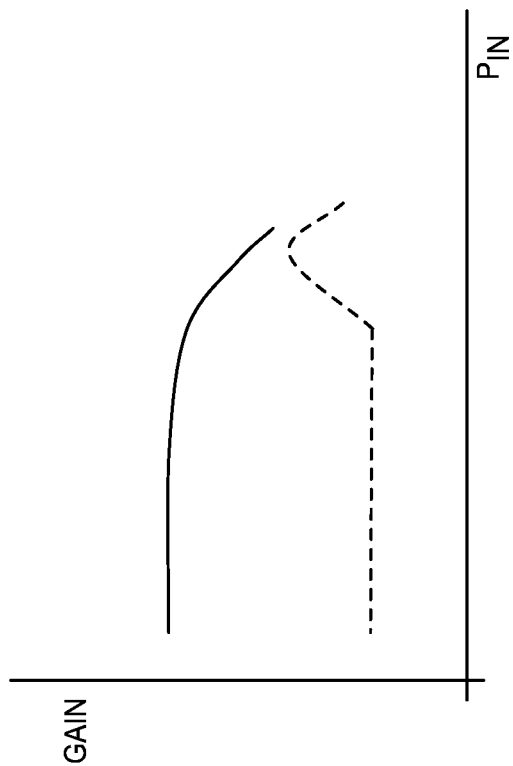
FIGS. 10A and 10B are graphs illustrating a gain compensation signal produced by the gain compensation circuitry in FIGS. 4 and 6 through 8 and its relationship to a gain of an RF PA according to one embodiment of the present disclosure.
Figure 10B:
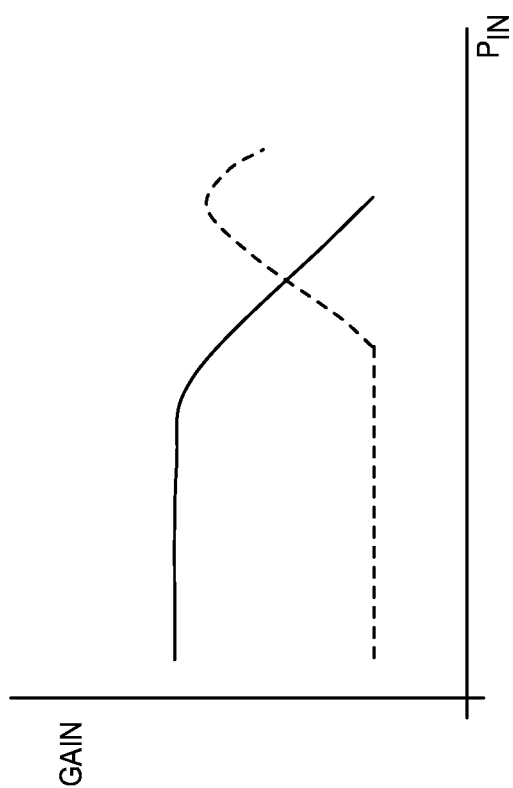

FIGS. 10A and 10B show the relationship of the gain response of the gain compensation circuitry discussed above to the gain response of an amplifier stage. As shown in FIGS. 10A and 10B, the gain response of the amplifier stage remains relatively constant over a particular input power range, and then begins to decrease. The period over which the gain of the amplifier stage remains constant is known as the small signal gain of the amplifier stage. As discussed in detail above, while the point at which the gain of the amplifier stage begins to decrease can be extended by increasing the supply voltage for the amplifier stage, there is a point at which the physical limits of the amplifier stage no longer allow such extension. Further, if an increase in gain is desired, the gain of the amplifier stage begins to decrease at a lower input power. Accordingly, to extend the input power range over which the gain response of the amplifier stage is linear, the gain response of the gain compensation circuitry is generated such that it is equal but opposite to the gain response of the amplifier stage. As shown in FIGS. 10A and 10B, as the gain of the amplifier stage begins to decrease, the gain response of the gain compensation circuitry begins to increase proportionally, such that the combination of the gain curves yields a linear gain response over a larger input power range. At a certain point, the gain response of the gain compensation circuitry similarly begins to decrease, thereby marking the new end of the linear operating range of the RF PA circuitry 16 even after applying the correction.

While the gain response of the gain compensation circuitry is shown compensating for compression, or a decrease in the gain response of the amplifier stage, the gain compensation circuitry may similarly compensate for undesirable expansion in the gain of an amplifier stage as described above. Notably, the gain response of the amplifier stage and thus the gain response of the gain compensation circuitry may be nonlinear, such that changes in the gain response of the amplifier stage are directly reflected in the gain response of the gain compensation circuitry to provide an extremely linear response of the RF PA circuitry 16.

Figure 11:
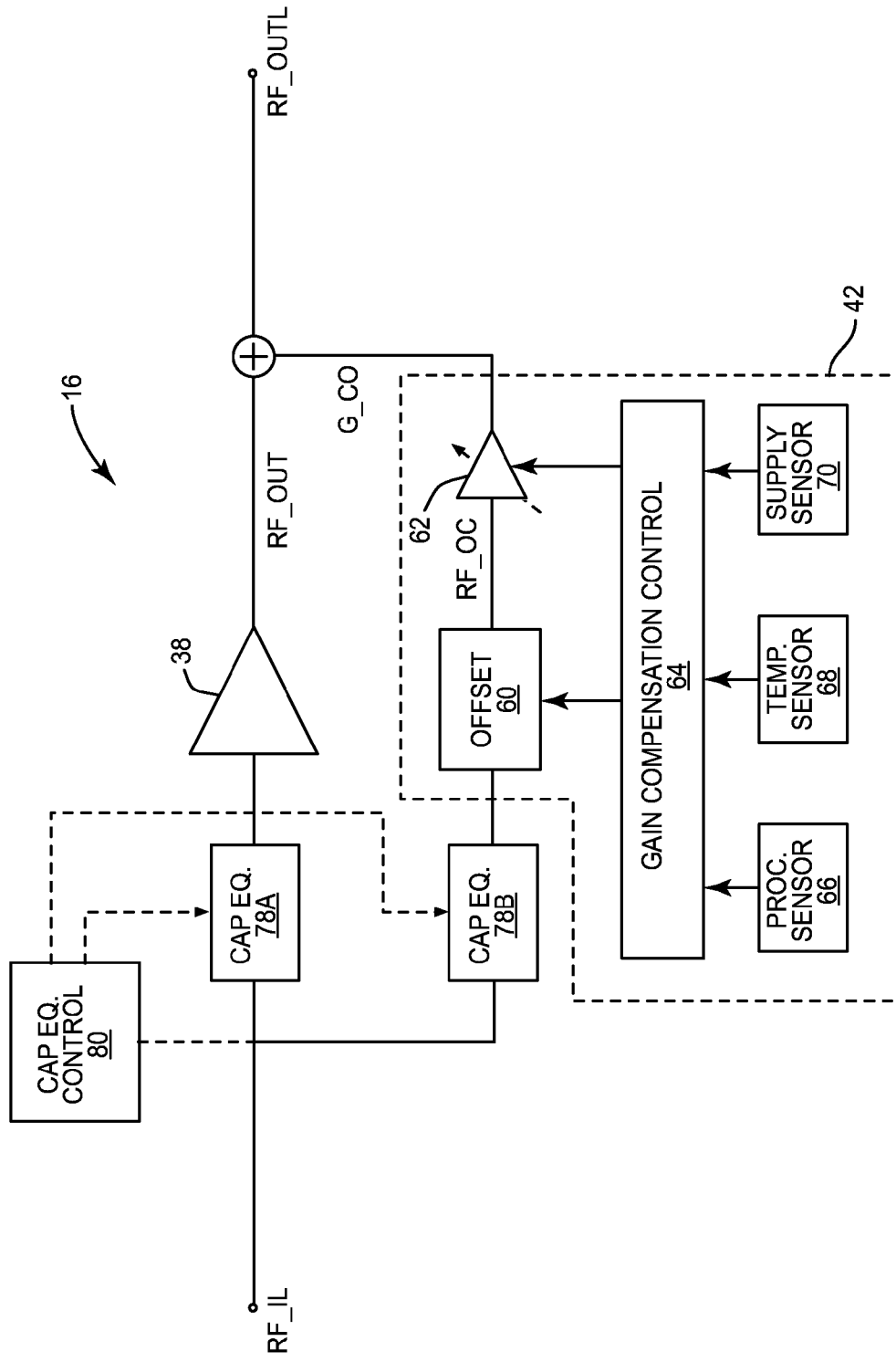
FIG. 11 is a schematic illustrating RF PA circuitry including gain compensation circuitry and capacitance equalization circuitry according to one embodiment of the present disclosure.

Although effective for increasing the linearity of the RF PA circuitry 16, using gain compensation circuitry may introduce significant phase distortion if not accounted for. Specifically, the input capacitance of the gain compensation circuitry may change significantly as a result of changes in the gain response thereof. Accordingly, FIG. 11 shows the RF PA circuitry 16 including capacitance equalization circuitry 78 and capacitance equalization control circuitry 80 according to one embodiment of the present disclosure. For simplicity, only the output amplifier stage 38 and the output stage gain compensation circuitry 42 are shown. The capacitance equalization circuitry 78 includes first capacitance equalization circuitry 78A coupled to an input of the output amplifier stage 38 and second capacitance equalization circuitry 78B coupled to an input of the output stage gain compensation circuitry 42. The capacitance equalization control circuitry 80 is coupled to each one of the first capacitance equalization circuitry 78A and the second capacitance equalization circuitry 78B. Further, the capacitance equalization control circuitry 80 is coupled to an input of the output amplifier stage 38 and the output stage gain compensation circuitry 42. The capacitance equalization control circuitry 80 measures or predicts a capacitance at the input of the output amplifier stage 38 and the output stage gain compensation circuitry 42 and adjusts the first capacitance equalization circuitry 78A and the second capacitance equalization circuitry 78B such that the capacitance remains constant throughout changes to the gain response of the gain compensation circuitry. Accordingly, even as the output gain compensation signal G_CO changes to compensate for nonlinearities in the gain response of the output amplifier stage 38, phase distortion in the RF PA circuitry 16 remains minimal. In general, the capacitance equalization circuitry 78 provides open-loop phase distortion compensation by providing a capacitance that is the inverse to a parasitic capacitance of the amplifier stage to which it is attached.

Figure 12:
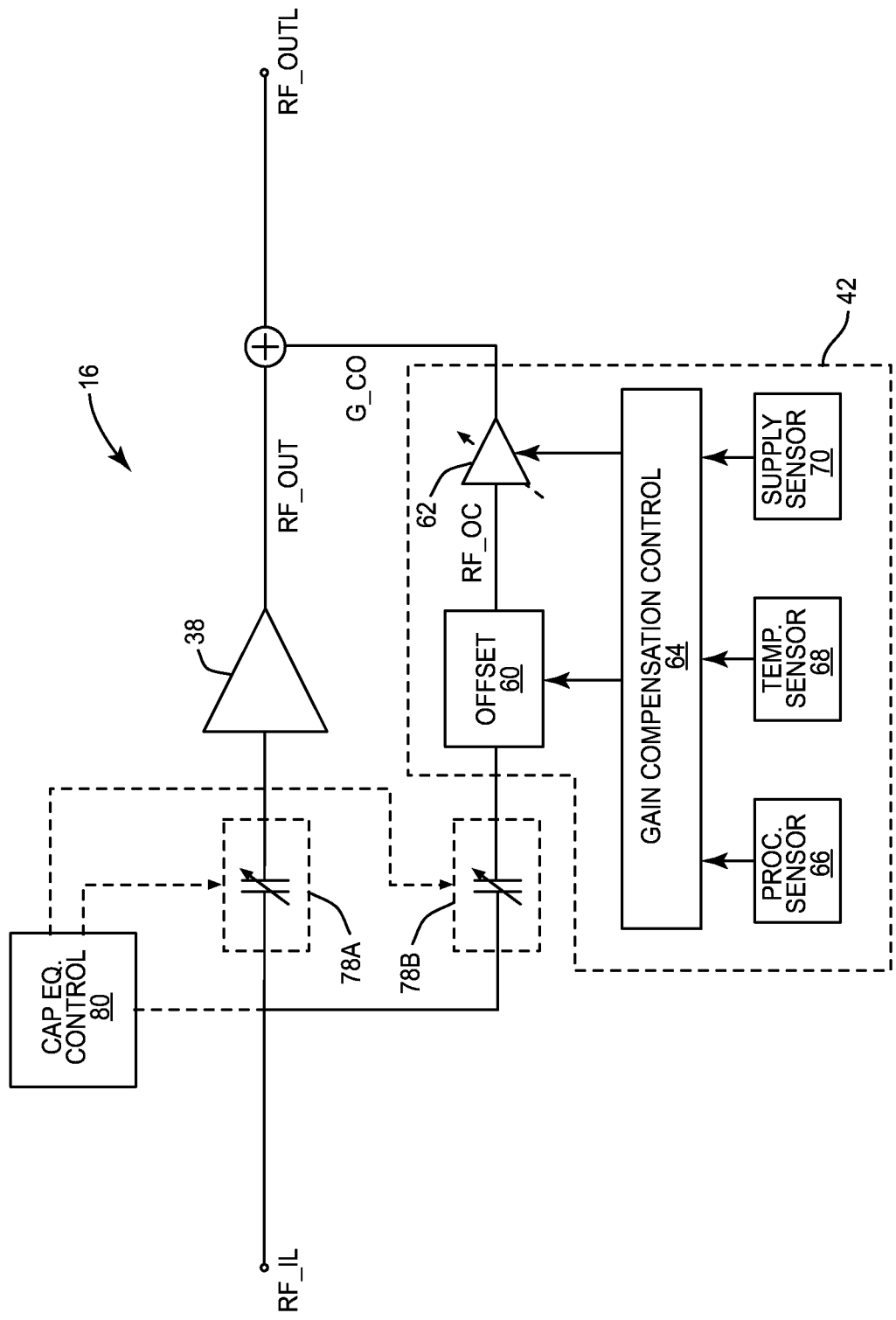
FIG. 12 is a schematic illustrating details of the RF PA circuitry including gain compensation circuitry and capacitance equalization circuitry shown in FIG. 11 according to one embodiment of the present disclosure.

FIG. 12 shows details of the capacitance equalization circuitry 78 according to one embodiment of the present disclosure. As shown in FIG. 12, the capacitance equalization circuitry 78 may be a variable capacitor component, such as a varactor or a digitally controlled switchable capacitor array. The capacitance equalization control circuitry 80 may control the capacitance equalization circuitry 78 in any suitable manner, for example, by providing a bias voltage thereto or a digital signal thereto.

Figure 13:
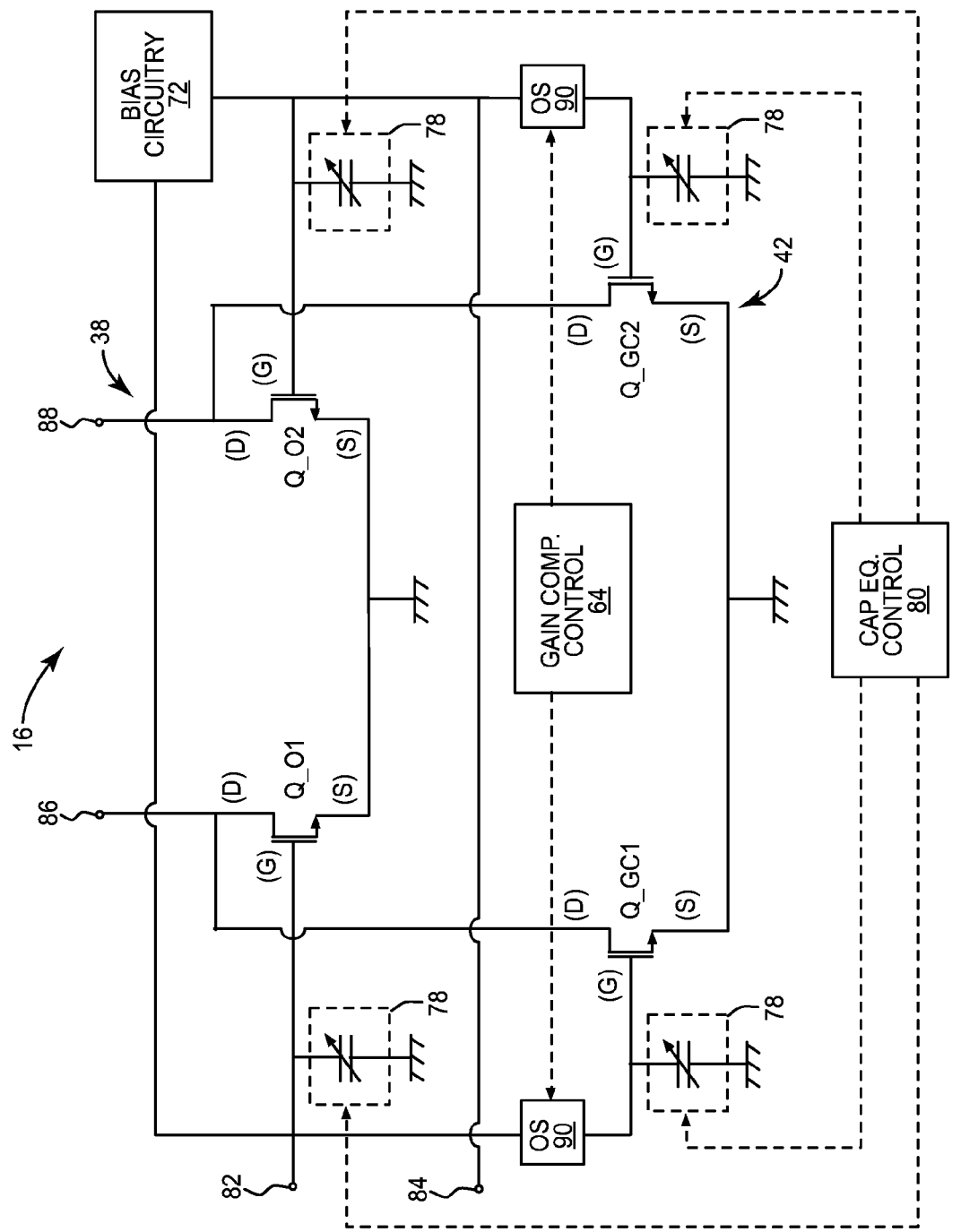
FIG. 13 is a schematic illustrating RF PA circuitry including gain compensation circuitry and capacitance equalization circuitry according to one embodiment of the present disclosure.

FIG. 13 shows details of the RF PA circuitry 16 including the capacitance equalization circuitry 78 according to one embodiment of the present disclosure. For purposes of simplicity, only the output amplifier stage 38 of the RF PA circuitry 16 is shown. The output amplifier stage 38 is a differential amplifier including a first output stage differential transistor Q_O1 and a second output stage differential transistor Q_O2. In one embodiment wherein the first output stage differential transistor Q_O1 and the second output stage differential transistor Q_O2 are MOSFET devices, a gate contact (G) of the first output stage differential transistor Q_O1 may be connected to a first input 82, a source contact (S) of the first output stage differential transistor Q_O1 may be grounded, and a drain contact (D) of the first output stage differential transistor Q_O1 may be connected to a first output 84. Similarly, a gate contact (G) of the second output stage differential transistor Q_O2 may be connected to a second input 86, a source contact (S) of the second output stage differential transistor Q_O2 may be grounded, and a drain contact (D) of the second output stage differential transistor Q_O2 may be connected to a second output 88. The capacitance equalization control circuitry 80 may be coupled to the gate contact (G) of each one of the first output stage differential transistor Q_O1 and the second output stage differential transistor Q_O2. The output amplifier stage 38 may receive an RF input signal RF_IN or intermediate RF signal RF_I, which may have been linearized by driver stage gain compensation circuitry, between the first input 82 and the second input 86. The output amplifier stage 38 may then amplify the signal to provide an RF output signal RF_OUT between the first output 84 and the second output 88.

The output stage gain compensation circuitry 42 may also include a first gain compensation differential transistor Q_GC1 and a second gain compensation differential transistor Q_GC2. In one embodiment in which the first gain compensation differential transistor Q_GC1 and the second gain compensation differential transistor Q_GC2 are MOSFET devices, a gate contact (G) of the first gain compensation differential transistor Q_GC1 may be coupled to the first input 82 and the bias circuitry 72 via bias offset circuitry 90, a source contact (S) of the first gain compensation differential transistor Q_GC1 may be grounded, and a drain contact (D) of the first gain compensation differential transistor Q_GC1 may be coupled to the first output 84. Further, a gate contact (G) of the second gain compensation differential transistor Q_GC2 may be coupled to the second input 86 and the bias circuitry 72 via bias offset circuitry 90, a source contact (S) of the second gain compensation differential transistor Q_GC2 may be grounded, and a drain contact (D) of the second gain compensation differential transistor Q_GC2 may be coupled to the second output 88. The capacitance equalization control circuitry 80 may be coupled to the gate contact (G) of the first gain compensation differential transistor Q_GC1 and the second gain compensation differential transistor Q_GC2. The output stage gain compensation circuitry 42 may receive the RF signal between the first input 82 and the second input 86 and provide a differential gain compensation signal G_CD between the first output 84 and the second output 88 that compensates for one or more nonlinearities in the gain response of the output amplifier stage 38.

The gain compensation control circuitry 64 is coupled to the bias offset circuitry 90 and configured to control a bias offset provided to the first gain compensation differential transistor Q_GC1 and the second gain compensation differential transistor Q_GC2 such that the output stage gain compensation circuitry 42 provides the differential gain compensation signal G_CD that counteracts and therefor compensates for one or more nonlinearities in the gain response of the output amplifier stage 38. Although not shown, the gain compensation control circuitry 64 may be coupled to one or more sensors associated with the output amplifier stage 38 in order to determine the required correction for the gain response of the output amplifier stage 38.

The capacitance equalization control circuitry 80 is coupled to the capacitance compensation circuitry 78 and provides control signals to the various capacitance compensation circuitry 78 such that a capacitance at the input of the RF PA circuitry 16 remains relatively constant even as the gain response of the gain compensation circuitry 20 changes. Accordingly, the output stage gain compensation circuitry 42 effectively linearizes at least a portion of the gain response of the output amplifier stage 38 without introducing phase distortion therein. Increasing the linearity of the output amplifier stage 38 may allow the output amplifier stage 38 to receive and amplify signals with higher input powers, operate at a higher gain, or both, thereby improving the performance of the RF PA circuitry 16.

Although only the output amplifier stage 38 is shown in the RF PA circuitry 16 shown in FIG. 13, the same concepts may be readily applied to any number of amplifier stages including the driver amplifier stage 36 discussed above. Further, although the various amplifier elements in the output amplifier stage 38 are shown as MOSFET devices, any number of different devices may be used without departing from the principles of the present disclosure. For example, the first output stage differential transistor Q_O1, the second output stage differential transistor Q_O2, the first gain compensation differential transistor Q_GC1, and the second gain compensation differential transistor Q_GC2 may be BJTs, HEMTs, or the like without departing from the principles described herein. As discussed above, correction for the entire signal path in a multi-stage amplifier can be applied to only one stage or to multiple stages. In general, it is easier to correct a lower power stage (e.g., a driver stage) than it is to correct a higher power stage (e.g., an output stage). Accordingly, often correction will be applied only to the lower power stage(s), while the output stage continues to provide its native response.

Those skilled in the art will recognize improvements and modifications to the embodiments of the present disclosure. All such improvements and modifications are considered within the scope of the concepts disclosed herein and the claims that follow.

What is claimed is:

1. Radio frequency (RF) power amplifier (PA) circuitry comprising:
   an amplifier stage configured to receive and amplify an RF input signal to provide an RF output signal;
   gain compensation circuitry coupled in parallel with the amplifier stage and configured to receive the RF input signal and provide a gain compensation signal, wherein the gain compensation signal is configured to increase a range of RF input power of the RF input signal over which a gain response of the RF PA circuitry remains substantially constant;
   an adder coupled between an output of the amplifier stage and the gain compensation circuitry and configured to receive and add the RF output signal and the gain compensation signal to provide a linearized RF output signal; and
   capacitance compensation circuitry coupled to an input of each one of the amplifier stage and the gain compensation circuitry and configured to maintain an input capacitance of the amplifier stage at a constant value.

2. The RF PA circuitry of claim 1 wherein a gain response of the gain compensation circuitry is non-linear.

3. The RF PA circuitry of claim 1 wherein the gain compensation circuitry comprises:
   offset adjustment circuitry configured to adjust a phase of the RF input signal to provide a phase-shifted RF signal; and
   gain slope adjustment circuitry coupled in series with the offset adjustment circuitry and configured to adjust a gain slope of the phase-shifted RF signal to provide the gain compensation signal.

4. The RF PA circuitry of claim 3 wherein the gain slope adjustment circuitry is a variable gain amplifier.

5. The RF PA circuitry of claim 3 wherein the gain compensation signal is non-linear.

6. The RF PA circuitry of claim 3 further comprising gain compensation control circuitry coupled to the gain compensation circuitry and configured to adjust the offset adjustment circuitry and the gain slope adjustment circuitry to produce a desired gain response of the gain compensation circuitry.

7. The RF PA circuitry of claim 6 wherein the gain compensation control circuitry is configured to adjust one or more operating parameters of the offset adjustment circuitry and the gain slope adjustment circuitry based on a supply voltage delivered to the amplifier stage.

8. The RF PA circuitry of claim 6 wherein the gain compensation control circuitry is configured to adjust one or more operating parameters of the offset adjustment circuitry and the gain slope adjustment circuitry based on a bias signal provided to the amplifier stage.

9. The RF PA circuitry of claim 6 wherein the gain compensation control circuitry is configured to adjust one or more operating parameters of the offset adjustment circuitry and the gain slope adjustment circuitry based on a saturation characteristic of an output amplifier stage in the RF PA circuitry.

10. The RF PA circuitry of claim 6 wherein the gain compensation control circuitry is configured to adjust one or more operating parameters of the offset adjustment circuitry and the gain slope adjustment circuitry based on one or more of a process measurement, a temperature measurement, or a supply voltage measurement.

11. The RF PA circuitry of claim 1 further comprising gain compensation control circuitry coupled to the gain compensation circuitry and configured to provide one or more control signals to the gain compensation circuitry to produce a desired gain response of the gain compensation circuitry.

12. The RF PA circuitry of claim 11 wherein the gain compensation circuitry comprises:
 offset adjustment circuitry configured to adjust an offset of the RF input signal based on a control signal provided by the gain compensation control circuitry to provide a phase-shifted RF signal; and
 gain slope adjustment circuitry coupled in series with the offset adjustment circuitry and configured to adjust a slope of the phase-shifted RF signal based on a control signal provided by the gain compensation control circuitry to provide the gain compensation signal.

13. The RF PA circuitry of claim 12 wherein the gain slope adjustment circuitry is a variable gain amplifier.

14. The RF PA circuitry of claim 1 wherein the capacitance compensation circuitry comprises:
 one or more varactors; and
 capacitance compensation control circuitry configured to adjust the one or more varactors such that an input capacitance of the amplifier stage is maintained at a constant value.

15. The RF PA circuitry of claim 1 wherein the RF PA is a multi-stage RF PA and the amplifier stage is a driver stage of the multi-stage RF PA.

16. The RF PA circuitry of claim 1 wherein the RF PA is a multi-stage RF PA and the amplifier stage is an output stage of the multi-stage RF PA.

17. The RF PA circuitry of claim 1 wherein the RF PA circuitry further comprises an additional amplifier stage.

18. Radio frequency (RF) power amplifier (PA) circuitry comprising:
 an amplifier stage configured to receive and amplify an RF input signal to provide an RF output signal;
 gain compensation circuitry coupled in parallel with the amplifier stage and configured to receive the RF input signal and provide a gain compensation signal, wherein the gain compensation signal is configured to linearize at least a portion of a gain response of the amplifier stage;
 an adder coupled between an output of the amplifier stage and the gain compensation circuitry and configured to receive and add the RF output signal and the gain compensation signal to provide a linearized RF output signal; and
 capacitance compensation circuitry coupled to an input of each one of the amplifier stage and the gain compensation circuitry and configured to maintain an input capacitance of the amplifier stage at a constant value.

19. The RF PA circuitry of claim 18 wherein the capacitance compensation circuitry comprises:
 one or more varactors; and
 capacitance compensation control circuitry configured to adjust the one or more varactors such that the input capacitance of the amplifier stage is maintained at a constant value.

20. Radio frequency (RF) power amplifier (PA) circuitry comprising:
 a driver amplifier stage configured to receive and amplify an RF input signal to provide an intermediate RF signal;
 driver stage gain compensation circuitry coupled in parallel with the driver amplifier stage and configured to receive the RF input signal and provide a driver stage gain compensation signal, wherein the driver stage gain compensation signal is configured to linearize at least a portion of a gain response of the driver amplifier stage;
 a driver stage adder coupled between an output of the driver amplifier stage and the driver stage gain compensation circuitry and configured to receive and add the intermediate RF signal and the driver stage gain compensation signal to provide a linearized intermediate RF signal;
 an output amplifier stage configured to receive and amplify the linearized intermediate RF signal to provide an RF output signal;
 output stage gain compensation circuitry coupled in parallel with the output amplifier stage and configured to receive the linearized intermediate RF signal and provide an output stage gain compensation signal, wherein the output stage gain compensation signal is configured to linearize at least a portion of the gain response of the output amplifier stage; and
 an output stage adder coupled between an output of the output amplifier stage and the output stage gain compensation circuitry and configured to receive and add the RF output signal and the output stage gain compensation signal to provide a linearized RF output signal.

21. The RF PA circuitry of claim 20 wherein each of the driver stage gain compensation circuitry and the output stage gain compensation circuitry comprises:
 offset adjustment circuitry configured to adjust an offset of an RF signal at an input of the gain compensation circuitry to provide a phase-shifted RF signal; and
 gain slope adjustment circuitry coupled in series with the offset adjustment circuitry and configured to adjust a slope of the phase-shifted RF signal to provide a gain compensation signal.

* * * * *